United States Patent
Judge et al.

(10) Patent No.: US 11,422,478 B2
(45) Date of Patent: Aug. 23, 2022

(54) CONTROL OF RETICLE PLACEMENT FOR DEFECTIVITY OPTIMIZATION

(71) Applicant: ASML HOLDING N.V., Veldhoven (NL)

(72) Inventors: Andrew Judge, Monroe, CT (US); Aage Bendiksen, Fairfield, CT (US); Pedro Julian Rizo Diago, Chappaqua, NY (US)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 16/630,508

(22) PCT Filed: Jun. 28, 2018

(86) PCT No.: PCT/EP2018/067361
§ 371 (c)(1),
(2) Date: Jan. 13, 2020

(87) PCT Pub. No.: WO2019/015930
PCT Pub. Date: Jan. 24, 2019

(65) Prior Publication Data
US 2020/0166855 A1    May 28, 2020

Related U.S. Application Data

(60) Provisional application No. 62/535,508, filed on Jul. 21, 2017.

(51) Int. Cl.
*G03F 7/20* (2006.01)

(52) U.S. Cl.
CPC ...... *G03F 7/70916* (2013.01); *G03F 7/70125* (2013.01)

(58) Field of Classification Search
CPC . G03F 7/20; G03F 7/0002; G03F 1/24; G03F 1/36; G03F 7/70775; G03F 1/22;
(Continued)

(56) References Cited

U.S. PATENT DOCUMENTS

| 7,198,276 | B2 | 4/2007 | Caldwell et al. |
| 2005/0087939 | A1* | 4/2005 | Caldwell ........ H01L 21/67288 279/128 |

(Continued)

FOREIGN PATENT DOCUMENTS

WO    2015161949    10/2015

OTHER PUBLICATIONS

International Seach Report and Written Opinion issued in corresponding PCT Patent Application No. PCT/EP2018/067361, dated Oct. 19, 2018.

(Continued)

*Primary Examiner* — Mesfin T Asfaw
(74) *Attorney, Agent, or Firm* — Pillsbury Winthrop Shaw Pittman LLP

(57) ABSTRACT

A system designed to couple a patterning device to a support structure having a plurality of burls includes a camera module, an actuator, and a controller. The camera module is designed to capture image data of a backside of the patterning device. The actuator is coupled to at least one burl of the plurality of burls and is designed to move the at least one burl. The controller is designed to receive the image data captured from the camera module and determine one or more locations of contamination on the backside of the patterning device from the image data. The controller is also designed to control the actuator to move the at least one burl of the plurality of burls away from the one or more locations of contamination on the backside of the patterning device, based on the determined locations of contamination.

25 Claims, 11 Drawing Sheets

(58) Field of Classification Search
CPC .............. G03F 7/70641; G03F 7/70716; G03F 7/70725; G03F 7/7085; G03F 7/707; G03F 7/70741; G03F 7/70783; G03F 7/70925; G03F 9/7023; G03F 1/84; G03F 7/70058; G03F 7/70216; G03F 7/70733; G03F 7/70866; G03F 7/70916; G03F 7/70125; G03F 7/70708
See application file for complete search history.

(56) References Cited

U.S. PATENT DOCUMENTS

| | | | |
|---|---|---|---|
| 2007/0211232 A1* | 9/2007 | Phillips | .................... G03F 1/82 355/30 |
| 2012/0002181 A1 | 1/2012 | Kyoh | |
| 2015/0077733 A1* | 3/2015 | Huang | ................ H01L 21/6833 355/72 |
| 2015/0125068 A1 | 5/2015 | Iwanaga et al. | |

OTHER PUBLICATIONS

Chinese Office Action issued in corresponding Chinese Patent Application No. 201880049194.0, dated Mar. 16, 2022.

\* cited by examiner

CONTROL OF RETICLE PLACEMENT FOR DEFECTIVITY OPTIMIZATION

CROSS-REFERENCE TO RELATED APPLICATIONS

This application is the U.S. national phase entry of PCT Application No. PCT/EP2018/067361, which was filed on Jun. 28, 2018, which claims the benefit of priority of U.S. Provisional Patent Application No. 62/535,508, which was filed on Jul. 21, 2017, and which is incorporated herein in its entirety by reference.

FIELD

The present disclosure relates to an electrostatic clamp for supporting an object, for example, a patterning device and/or a substrate in a lithographic apparatus, and a method for coupling the object to the electrostatic clamp.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction. It is also possible to transfer the pattern from the patterning device to the substrate by imprinting the pattern onto the substrate.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA, or by decreasing the value of $k_1$.

In order to shorten the exposure wavelength, and thus, reduce the minimum printable size, it has been proposed to use an extreme ultraviolet (EUV) radiation source. EUV radiation is electromagnetic radiation having a wavelength within the range of 5-20 nm, for example within the range of 13-14 nm, for example within the range of 5-10 nm such as 6.7 nm or 6.8 nm. Possible sources include, for example, laser-produced plasma sources, discharge plasma sources, or sources based on synchrotron radiation provided by an electron storage ring.

The radiation generated by such sources will not, however, be only EUV radiation and the source may also emit at other wavelengths including infra-red (IR) radiation and deep ultra-violet (DUV) radiation. DUV radiation can be detrimental to the lithography system as it can result in a loss of contrast. Furthermore unwanted IR radiation can cause heat damage to components within the system. It is therefore known to use a spectral purity filter to increase the proportion of EUV in the transmitted radiation and to reduce or even eliminate unwanted non-EUV radiation such as DUV and IR radiation.

A lithographic apparatus using EUV radiation may require that the EUV radiation beam path, or at least substantial parts of it, must be kept in vacuum during a lithographic operation. In such vacuum regions of the lithographic apparatus, an electrostatic clamp may be used to clamp an object, such as a patterning device and/or a substrate to a structure of the lithographic apparatus, such as a patterning device table and/or a substrate table, respectively.

The interface between the electrostatic clamp and the object is subject to wear at the contact points on either or both the electrostatic clamp and the object. This issue is made worse when contamination particles are present between the electrostatic clamp and the object. For future lithography systems, increased acceleration of the components, heating, and other factors are expected to exacerbate the problem. Furthermore, the presence of contamination particles between the patterning device and the electrostatic clamp may lead to overlay issues, damage to the patterning device, or damage to the electrostatic clamp.

SUMMARY

Accordingly, there is a need for an electrostatic clamp that can be configured to securely hold an object and prevent or minimize wear due to contamination, as well as a method of coupling the object to the electrostatic clamp to prevent or minimize wear due to contamination.

According to an embodiment, a lithographic apparatus includes an illumination system, a support structure, a projection system, and a controller. The illumination system is designed to receive extreme ultraviolet (EUV) radiation and to direct the EUV radiation towards a patterning device, such that patterned EUV radiation is reflected from the patterning device. The support structure includes a plurality of burls and is designed to support the patterning device on the plurality of burls. The projection system is designed to receive the patterned EUV radiation and to direct the patterned EUV radiation towards the substrate. The controller is designed to receive image data corresponding to a backside of the patterning device and determine one or more locations of contamination on the backside of the patterning device from the image data. The controller is further designed to determine a position of the patterning device in an X-Y plane such that the one or more locations of contamination on the backside of the patterning device does not align with any of the plurality of burls on the support structure.

In another embodiment, a lithographic apparatus includes an illumination system, a support structure, an actuator, a projection system, and a controller. The illumination system is designed to receive extreme ultraviolet (EUV) radiation and to direct the EUV radiation towards a patterning device, such that patterned EUV radiation is reflected from the patterning device. The support structure includes a plurality of burls and is designed to support the patterning device on the plurality of burls. The actuator is coupled to at least one burl of the plurality of burls and is configured to move the at least one burl in a direction normal to a largest surface of the support structure. The projection system is designed to receive the patterned EUV radiation and to direct the patterned EUV radiation towards the substrate. The controller is designed to receive image data corresponding to a backside of the patterning device and determine one or more locations of contamination on the backside of the patterning device from the image data. The controller is further designed to activate the actuator to move the at least one burl away from the one or more locations of contamination on the backside of the patterning device.

Yet in another embodiment, a system designed to couple a patterning device to a support structure having a plurality of burls includes a camera module, a mechanical arm, and a controller. The camera module is designed to capture image data of a backside of the patterning device. The mechanical arm is designed to support the patterning device and bring the patterning device into contact with the plurality of burls on the support structure. The controller is designed to receive the image data captured from the camera module and determine one or more locations of contamination on the backside of the patterning device from the image data. The controller is also designed to determine a position of the pattering device in an X-Y plane such that the one or more locations of contamination on the backside of the patterning device does not align with any of the plurality of burls on the support structure. Based on the determined position, the controller also controls the mechanical arm to couple the patterning device with the support structure.

Yet in another embodiment, a system designed to couple a patterning device to a support structure having a plurality of burls includes a camera module, an actuator, and a controller. The camera module is designed to capture image data of a backside of the patterning device. The actuator is coupled to at least one burl of the plurality of burls and is designed to move the at least one burl in a direction normal to a largest surface of the support structure. The controller is designed to receive the image data captured from the camera module and determine one or more locations of contamination on the backside of the patterning device from the image data. The controller is also designed to control the actuator to move the at least one burl of the plurality of burls away from the one or more locations of contamination on the backside of the patterning device, based on the determined locations of contamination.

Yet in another embodiment, a method of coupling a patterning device to a support structure having a plurality of burls includes capturing an image of a backside of the patterning device and determining, from the captured image, one or more locations of contamination on the backside of the patterning device. The method also includes determining a position of the pattering device in an X-Y plane such that the one or more locations of contamination on the backside of the patterning device does not align with any of the plurality of burls on the support structure and positioning the patterning device over the plurality of burls, based on the determined position.

Yet in another embodiment, a method of coupling a patterning device to a support structure having a plurality of burls includes capturing an image of a backside of the patterning device and determining, from the captured image, one or more locations of contamination on the backside of the patterning device. The method also includes actuating one or more burls of the plurality of burls, such that the one or more burls are moved away from the one or more locations of contamination on the backside of the patterning device and positioning the patterning device over the plurality of burls.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1:
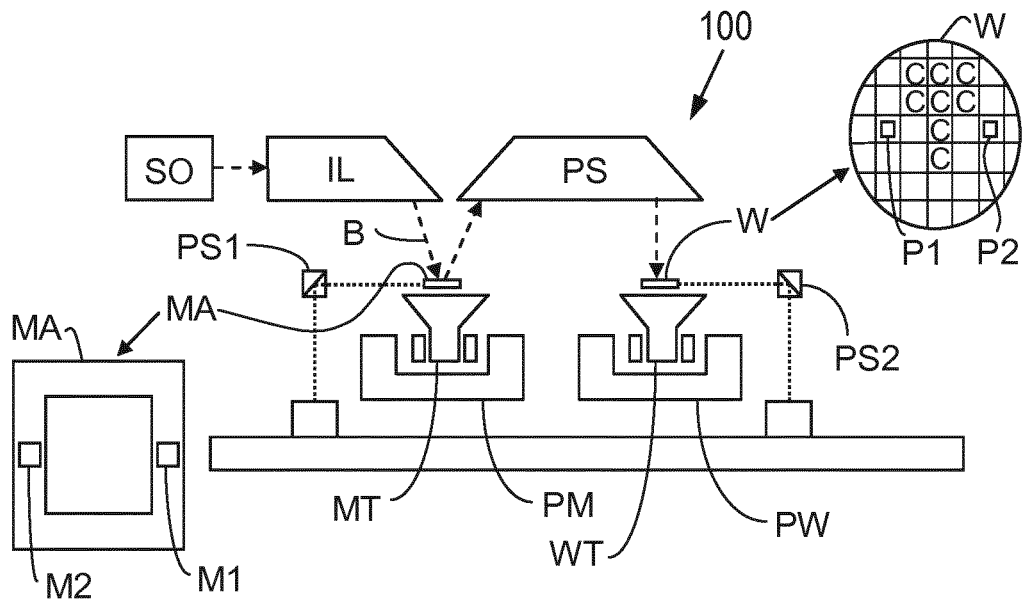
FIG. 1 is a schematic illustration of a reflective lithographic apparatus, according to an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number. Unless otherwise indicated, the drawings provided throughout the disclosure should not be interpreted as to-scale drawings.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing such embodiments in more detail, however, it is instructive to present an example environment in which embodiments of the present invention may be implemented.

Example Reflective Lithographic System

FIG. 1 schematically shows a lithographic apparatus 100 including a source collector module SO according to an embodiment of the invention. The apparatus comprises: an illumination system (illuminator) IL configured to condition a radiation beam B (e.g., EUV radiation); a support structure (e.g., a mask table) MT constructed to support a patterning device (e.g., a mask or a reticle) MA and connected to a first positioner PM configured to accurately position the patterning device; a substrate table (e.g., a wafer table) WT constructed to hold a substrate (e.g., a resist-coated wafer) W and connected to a second positioner PW configured to accurately position the substrate; and a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be reflective (as in lithographic apparatus 100 of FIG. 1) or transmissive. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable minor array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the lithographic apparatus is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector apparatus SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector apparatus SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector apparatus. The laser and the source collector apparatus may be separate entities, for example when a $CO_2$ laser is used to provide the laser beam for fuel excitation.

In such cases, the laser is not considered to form part of the lithographic apparatus and the laser beam is passed from the laser to the source collector apparatus with the aid of a beam delivery system comprising, for example, suitable directing mirrors and/or a beam expander.

In an alternative method, often termed discharge produced plasma ("DPP") the EUV emitting plasma is produced by using an electrical discharge to vaporise a fuel. The fuel may be an element such as xenon, lithium or tin which has one or more emission lines in the EUV range. The electrical discharge may be generated by a power supply which may form part of the source collector apparatus or may be a separate entity that is connected via an electrical connection to the source collector apparatus.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:

In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.

In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable minor array of a type as referred to above.

Combinations and/or variations on the above described modes of use or entirely different modes of use may also be employed.

Figure 2:
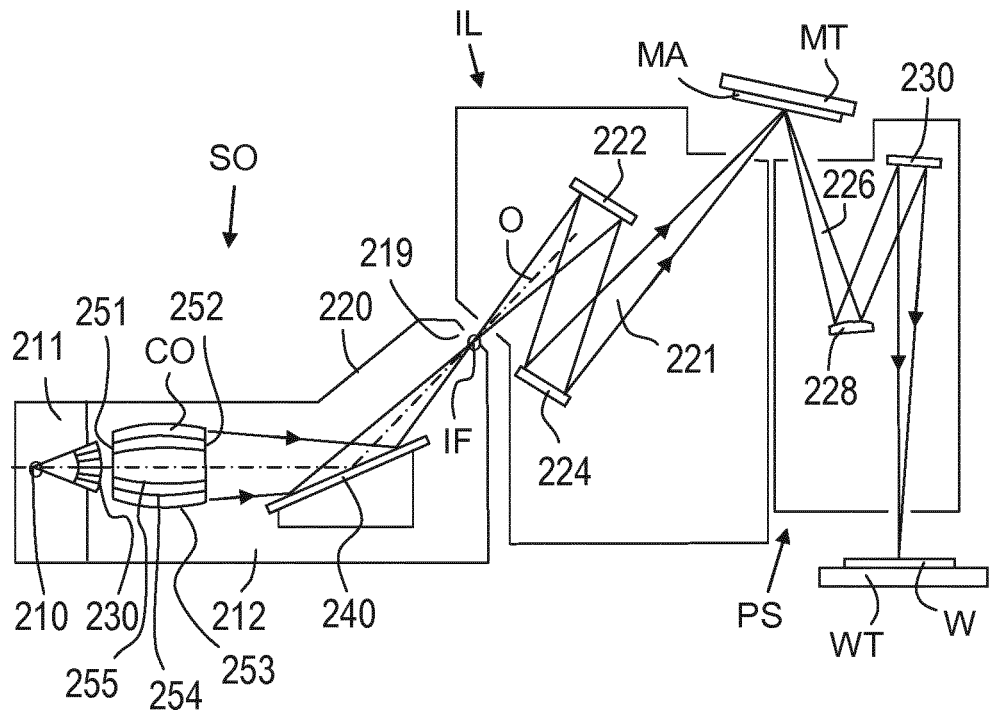
FIG. 2 is a more detailed schematic illustration of the reflective lithographic apparatus, according to an embodiment of the invention.

FIG. 2 shows the lithographic apparatus 100 in more detail, including the source collector apparatus SO, the illumination system IL, and the projection system PS. The source collector apparatus SO is constructed and arranged such that a vacuum environment can be maintained in an enclosing structure 220 of the source collector apparatus SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 212 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which may include a facetted field mirror device 222 and a facetted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 230 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figs., for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Figure 3A:
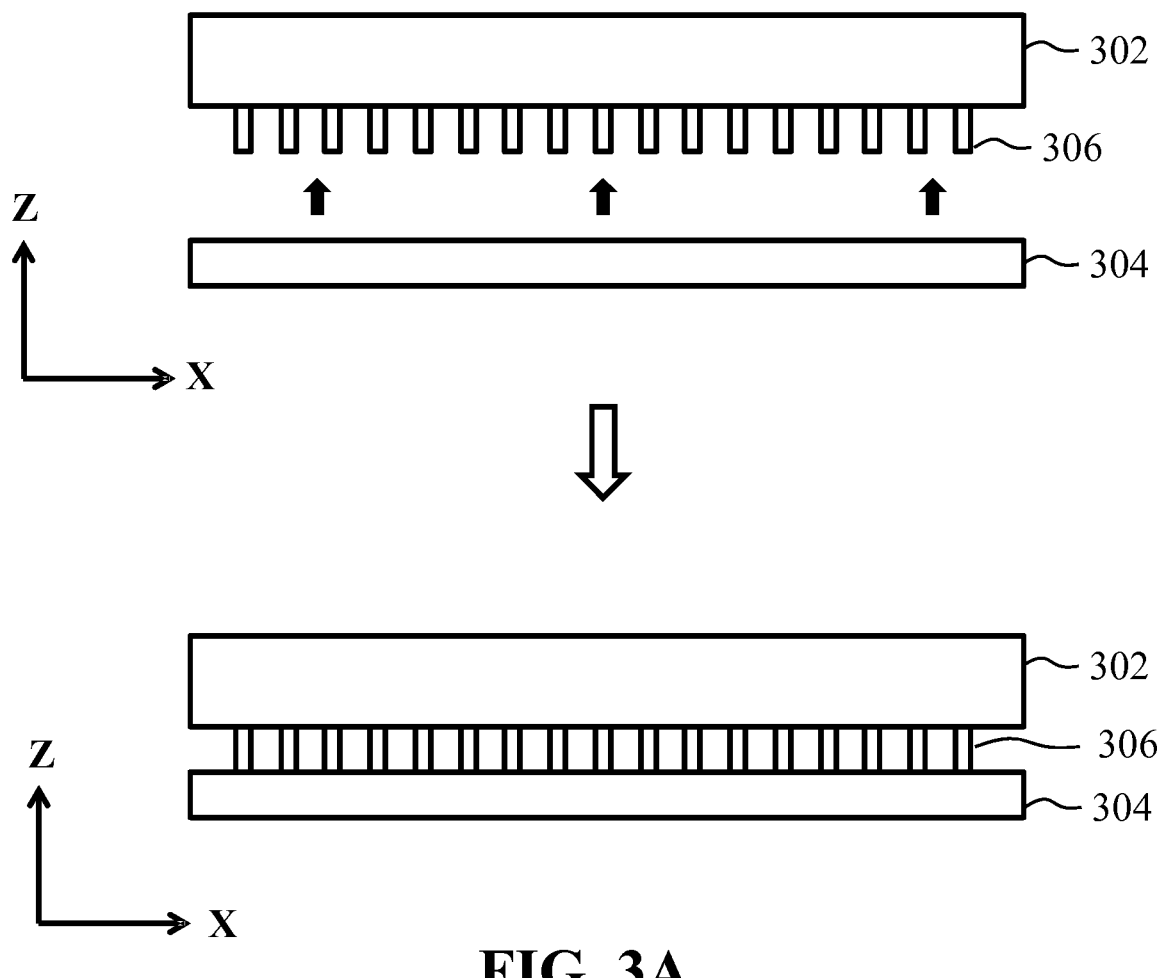
FIG. 3A is a side view of an object coupling with a support structure.

FIG. 3A illustrates a schematic of a cross-sectional view of a support structure 302 that can be implemented as a part of lithographic apparatus 100. Support structure 302 may be designed to support an object 304 via a plurality of burls 306 on support structure 302. Object 304 may be a patterning device or a wafer. Object 304 may be any other component that may be used within lithographic apparatus 100, such as for example, a lens or a mirror.

As illustrated in FIG. 3A, object 304 is brought towards support structure 302 in a Z-direction in order to be electrostatically clamped via burls 306 where contact is made with a backside of object 304. In this context, the backside of object 304 is the surface facing towards support structure 302 while a front side of object 304 is the opposite surface facing away from support structure 302. In the example where object 304 is a patterning device, the front side of object 304 includes a patterned reflective surface to reflect incoming EUV radiation.

Figure 3B:
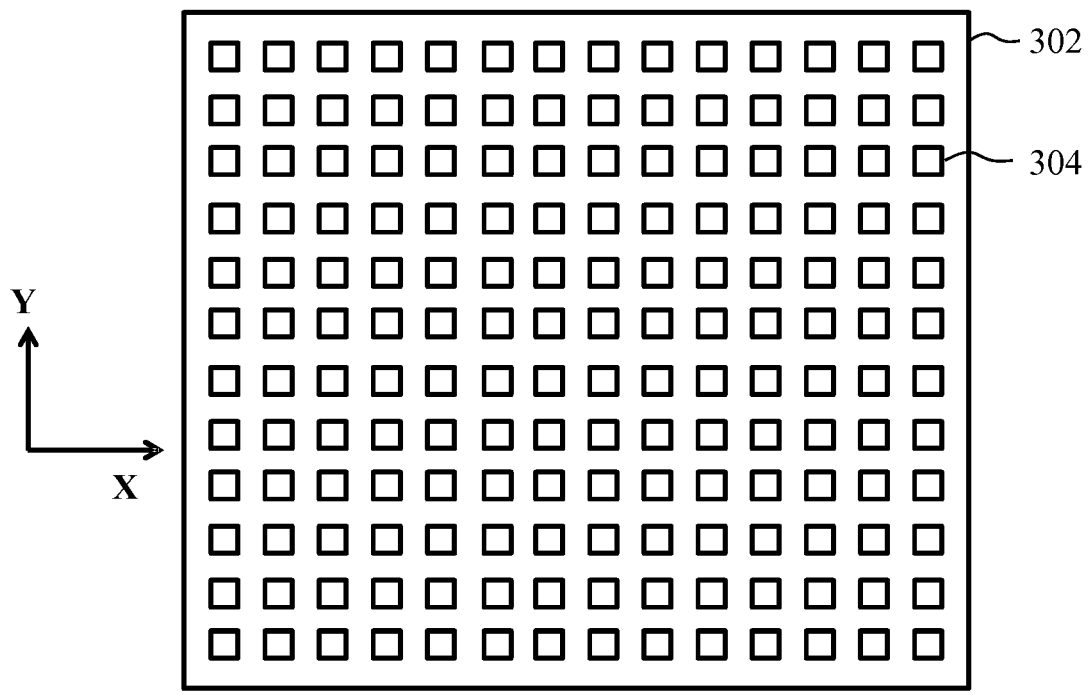
FIG. 3B is a top view of a plurality of burls across a surface of the support structure.

FIG. 3B illustrates a top view of support structure 302 to show the array of burls 304 across its surface. Each of burls 304 may be between 1 micrometer and 20 micrometers in height. In one example, each of burls 304 is about 10 micrometers in height. In another example, each of burls 304 is less than 5 micrometers in height. Support structure 302 may include as many as 5000, 4000, 3000, 2000, or 1000 burls 304 across its surface. Each of burls 304 may be arranged equidistant from one another, or may be arranged in a specific repeating pattern. The cross-section shape of each burl 304 may be any shape including square (as illustrated), circular, triangular, etc.

Figure 3C:
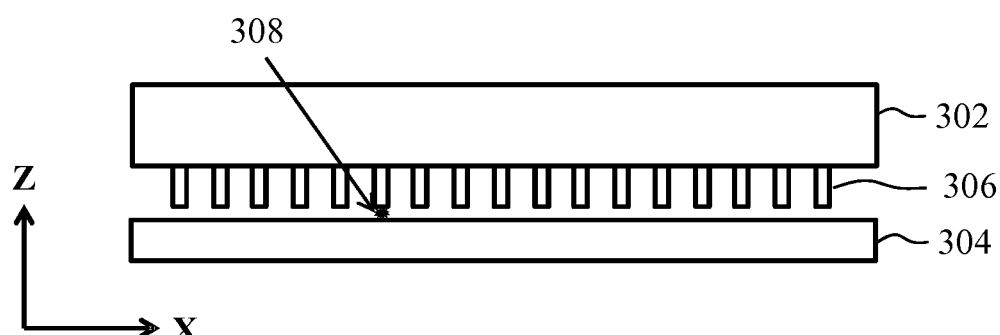
FIG. 3C is a side view of an object coupling with a support structure with contamination present.

FIG. 3C illustrates another side view of object 304 coupled to support structure 302 with contamination 308 present. Contamination 308 may be a particle, or an agglomeration of particles, of foreign matter. As illustrated in FIG. 3C, when contamination on a backside of object 304 aligns with any burl 306, it creates a wear location that can damage either object 304 or patterning device 302. Furthermore, the presence of contamination 308 can affect the overall angle of coupling between object 304 and support structure 302, or cause local disturbances in the flatness of the surfaces of object 304 near the contamination sites. These minor shifts in the position and flatness of object 304 may have a negative effect on the ability for object 304 to precisely reflect EUV radiation when object 304 is a patterning device.

According to an embodiment, an imaging device, or a controller coupled to the imaging device, may be used to determine the location of any contamination present on the backside of the object 304. Afterwards, this information may be used to adjust the position of object 304 such that the contamination does not contact any of the burls 306 when object 304 is clamped to support structure 302. For example, object 304 may be aligned in an X-Y plane parallel to the largest surface of support structure 302 and then brought into contact with the burls 306 of support structure 302, such that any contamination present falls between the array of burls.

Figure 4:
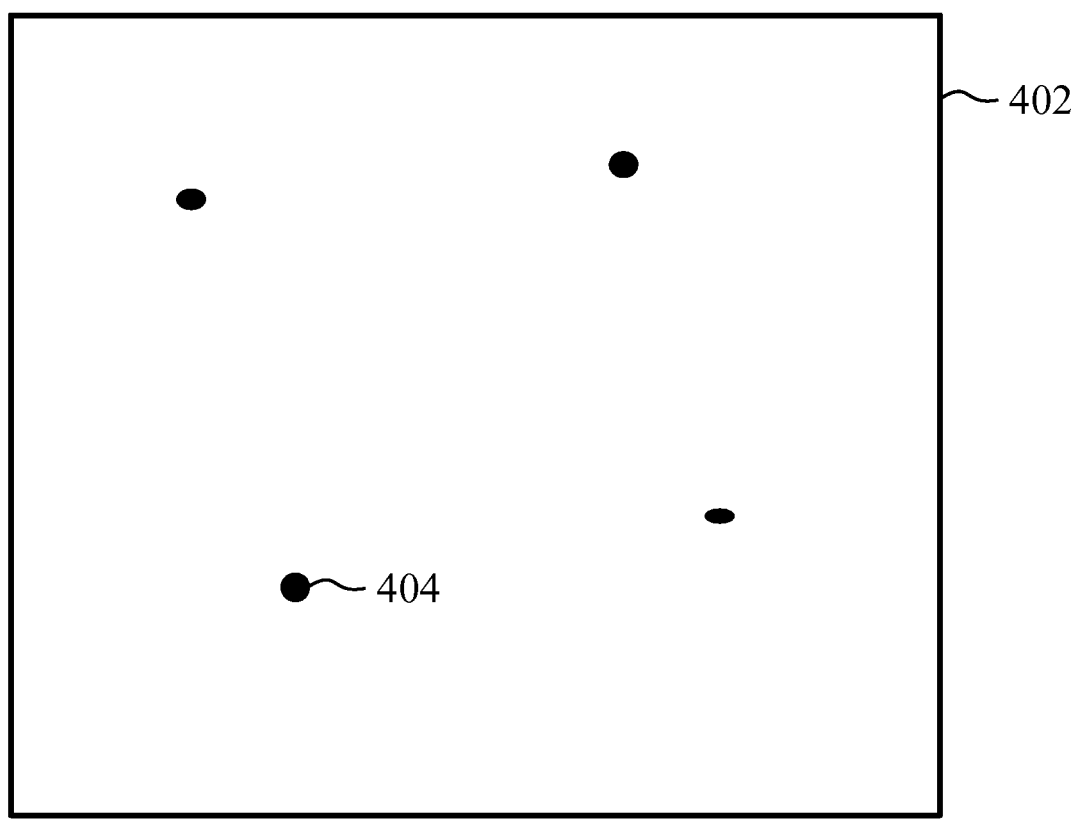
FIG. 4 is an example representation of a captured image of a backside of an object, according to an embodiment.

FIG. 4 illustrates an example image 402 that may be provided by an imaging device, according to an embodiment. Image 402 is taken across a backside of object 304 and one or more contamination locations 404 may be identified within image 402. The imaging device that captures image 402 may include a charge coupled device (CCD) or a MOSFET image sensor. As can be seen from image 402, numerous contamination locations of various size may be identified within image 402.

One or more contamination locations 404 may be identified through a variety of techniques. In one example, one or more contamination locations 404 are provided as brighter spots in image 402 due to light scattering off of the particles present on the backside of the object being imaged. In another example, image recognition algorithms may be used to determine any abnormal regions caused by the presence of contamination.

In an embodiment, the backside of object 304 may be cleaned in-situ based on the determined one or more contamination locations 404. Various cleaning methods may involve a physical "wipe" clean of the backside surface, an ultrasonic clean, or grinding away the contamination using a hard block material (stone clean). In another example, a separate cleaning reticle is used to clean the backside of object 304.

Figure 5A:
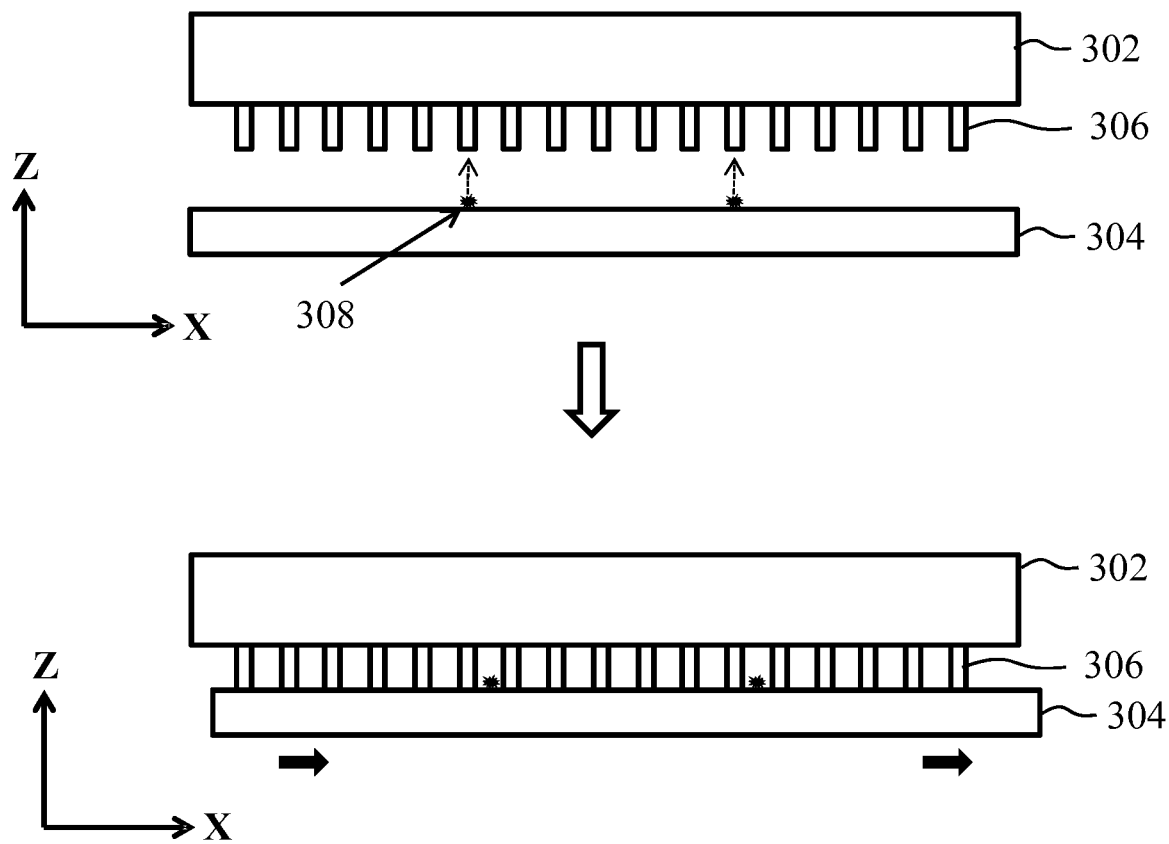
FIG. 5A is a side view of an object coupling with a support structure to avoid contact with contamination, according to an embodiment.

Once the data related to the position of any contamination on the backside of object 304 is known from the captured image 402, object 304 may be aligned over support structure 302 such that the contamination does not contact any of burls 306 as illustrated schematically in FIG. 5A, according to an embodiment. Particles 308 would be trapped between burls 306 and object 304 if object 304 were aligned directly over support structure 302 as indicated by the dashed arrows. However, since the locations of particles 308 may be known beforehand due to the captured image 402, object 304 may be shifted in the X-Y plane parallel to the largest surface of support structure 302 such that any contamination particles 308 do not contact any of burls 306. As shown at the bottom of FIG. 5A, object 304 is able to contact each of burls 306 without any disruption caused by contamination.

Figure 5B:
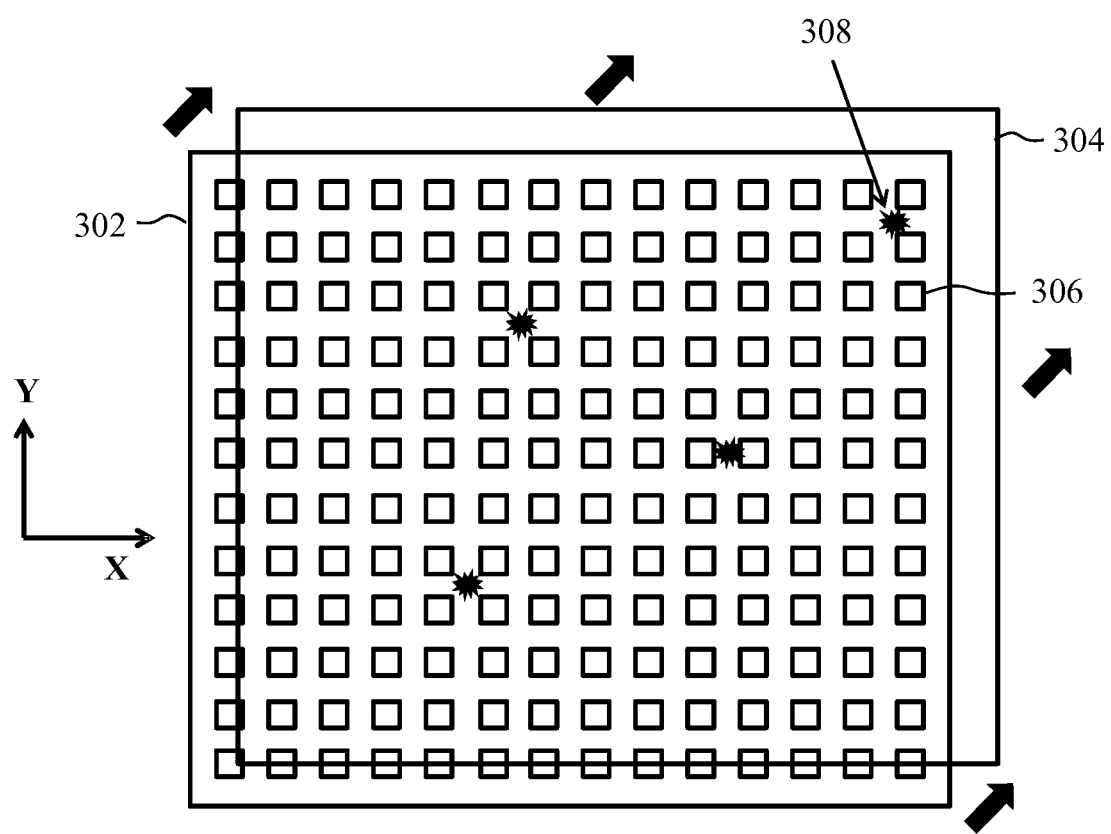
FIG. 5B is a top view of an object coupling with a support structure to avoid contact with contamination, according to an embodiment.

FIG. 5B illustrates a top-down view of object 304 aligning over support structure 306, according to an embodiment. Object 304 has been shifted in the X-Y plane such that each contamination location 308 is not aligned with any of burls 306. The shifting between object 304 and support structure 302 may only be on the order of micrometers, or on the order of nanometers. In some embodiments, object 304 may also be rotated about the Z-axis by some determined angle in order to avoid or minimize the alignment of each contamination location 308 over any of the burls 306.

In some embodiments, it may not be possible to avoid all contamination locations from aligning with one or more burls due to either the number of contamination locations, the size of the contamination, or both. Is such instances, object 304 may be shifted to a position that minimizes contact between any contamination present and burls 306.

Figure 6:
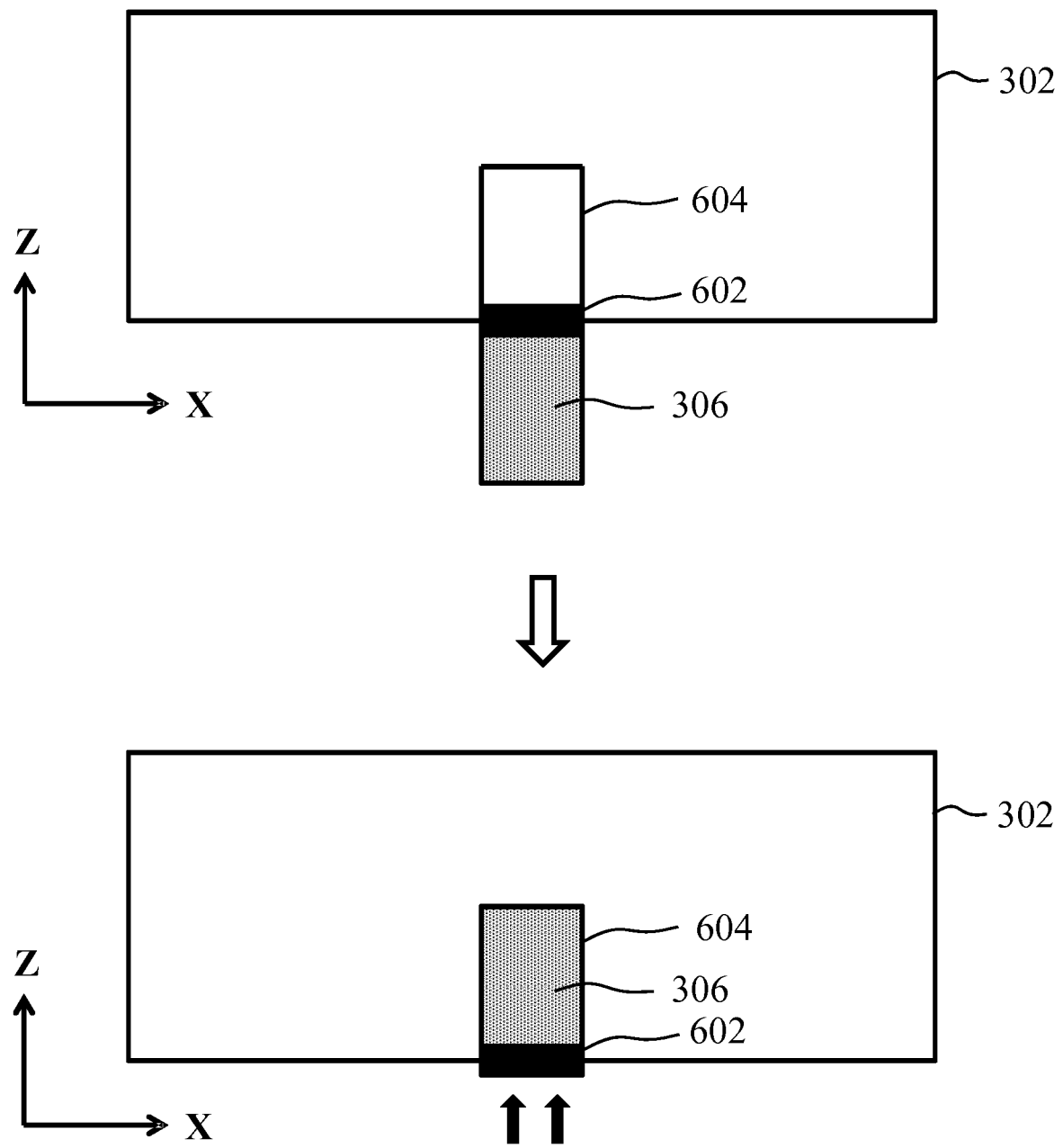
FIG. 6 is a schematic illustration of a burl being moved by an actuator, according to an embodiment.

One or more of burls 306 may be capable of movement such that the burl can move in the Z direction to either retract towards the surface of support structure 302 or extend out away from the surface of support structure 302. FIG. 6 illustrates a single burl 306 coupled to an actuator 602 that can move burl 306 back into a recess 604, according to an embodiment. Actuator 602 may utilize any type of actuating mechanism, for example, actuator 602 may include a piezoelectric element, a thermoelectric element, or a magnetostrictive element.

Actuator 602 may be designed to move burl 306 between two positions, one being entirely within recess 604, and the other being fully extended as shown at the top of FIG. 6. In another example, actuator 602 is designed to move actuator 306 in a more analog fashion to any position between full extension and full retraction. Actuator 602 may provide a movement resolution on the order of nanometers or on the order of micrometers. Only a single burl 306 is illustrated in FIG. 6 for clarity, and it should be understood that any number of burls 306 across support structure 302 may have its own actuator, such that each burl is individually addressable. In another embodiment, groups of burls may be coupled together to a single actuator, such that each burl 306 in the group would move together. For example, as many as 10 burls, 15 burls, 20 burls, 25 burls, or 50 burls may be grouped together with a single actuator to move substantially simultaneously. A given group of burls may each be located proximate to one another, or the group of burls may be randomly dispersed among the total number of burls across support structure 302.

Figure 7:
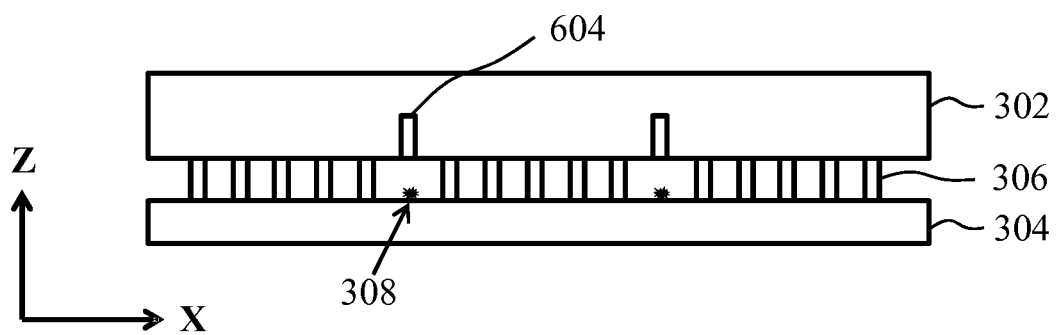
FIG. 7 is a side view of an object coupling with a support structure having retracted burls, according to an embodiment.

By retracting certain burls or groups of burls, contamination present on the backside of object 304 may be avoided. FIG. 7 illustrates how object 304 may be coupled to support structure 302 via burls 306, where certain burls have been retracted into recess 604, according to an embodiment. The retracted burls are burls that would have contacted contamination 308 if they had not been retracted. The retracted burls may be retracted entirely into recess 604, or only retracted far enough to not contact contamination 308. As discussed previously, data related to the position of contamination 308 on the backside of object 304 may be retrieved from an image of the backside of object 304. This information regarding the position of contamination 308 may then be used to determine which burls, or groups of burls, to retract such no burls come into contact with contamination 308. In another embodiment, burls that have contamination present on them, or that are damaged, may be retracted to avoid damaging or contaminating object 304.

Figure 8:
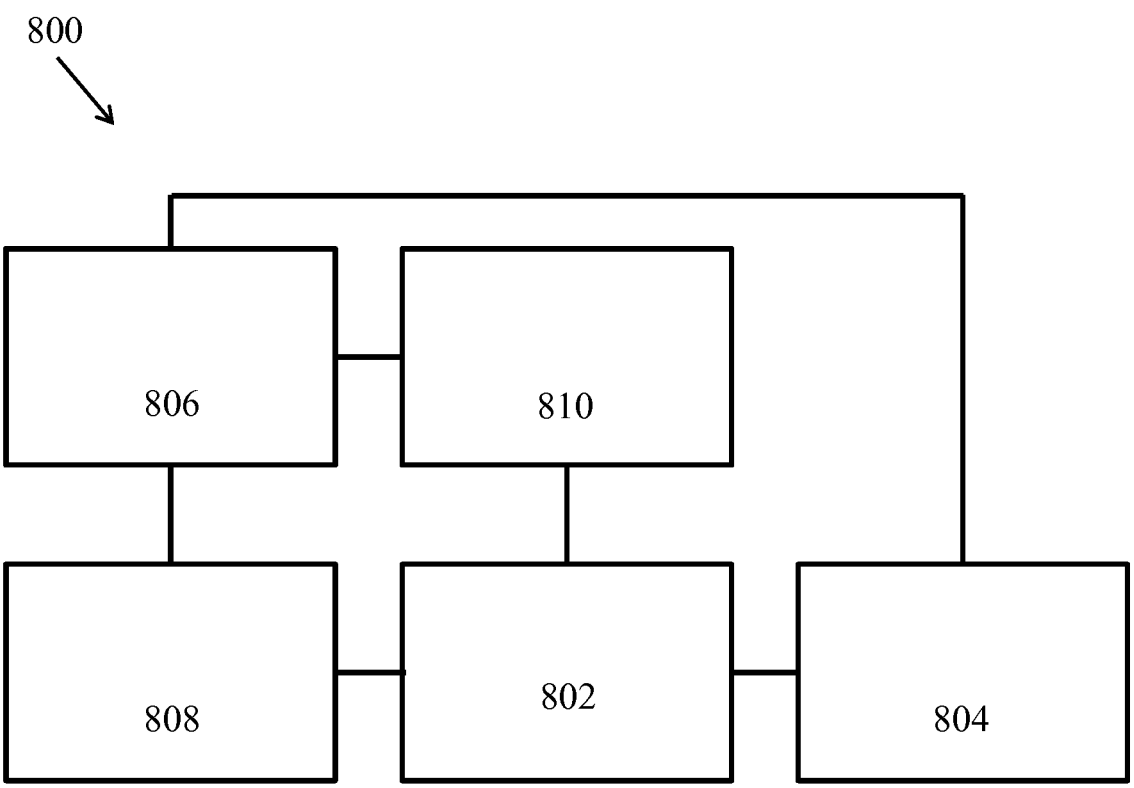
FIG. 8 is a diagram of a system designed to couple an object to a support structure, according to an embodiment.

FIG. 8 illustrates an example system 800 that is designed to couple object 802 to a support structure 804, according to an embodiment. System 800 may be provided within a lithographic apparatus, such as lithographic apparatus 100. Object 802 may represent any number of various components that may need to be positioned within a lithographic apparatus, such as a patterning device or a wafer. Support structure 804 may include a plurality of burls as described above with reference to FIGS. 3A-3B. A robot arm 810 may be used to move object 802 in at least three degrees of freedom (X translation, Y translation, Z translation) and at most six degrees of freedom (including tilt about the X-axis, about the Y-axis, and about the Z-axis). Robot arm 810 may be used to align object 802 with support structure 804 and move object 802 towards support structure 804. In one embodiment, object 802 is electrostatically clamped to support structure 804 once object 802 has made contact with support structure 804.

System 800 includes a controller 806 for controlling the actions of various components of system 800, and for processing data collected from a camera 808. Camera 808 may be used to capture an image of a backside of object 802 in order to determine one or more locations of contamination. Camera 808 may include a CCD element or a plurality of MOSFET image sensors. Camera 808 may utilize white light for capturing the image, or may utilize a more narrow spectrum comprising only a single visible color of light. In other embodiments, camera 808 utilizes infrared radiation to capture an image of the backside of object 802.

Controller 806 may be designed to receive image data from camera 808 and to determine one or more locations of contamination from the image data. For example, controller 806 may use one or more image processing techniques to determine the locations of contamination as discussed above with reference to FIG. 4. In an embodiment, controller 806 positions object 802 using robot arm 810 and based on the analyzed image data to avoid contacting any of the burls of support structure 804 with the contamination. In another embodiment, controller 806 sends signals to one or more actuators coupled to burls on support structure to retract a certain number of burls on support structure 804. Controller 806 may use the received image data to determine which burls, or groups of burls, to retract in order to avoid contact with the contamination.

Figure 9:
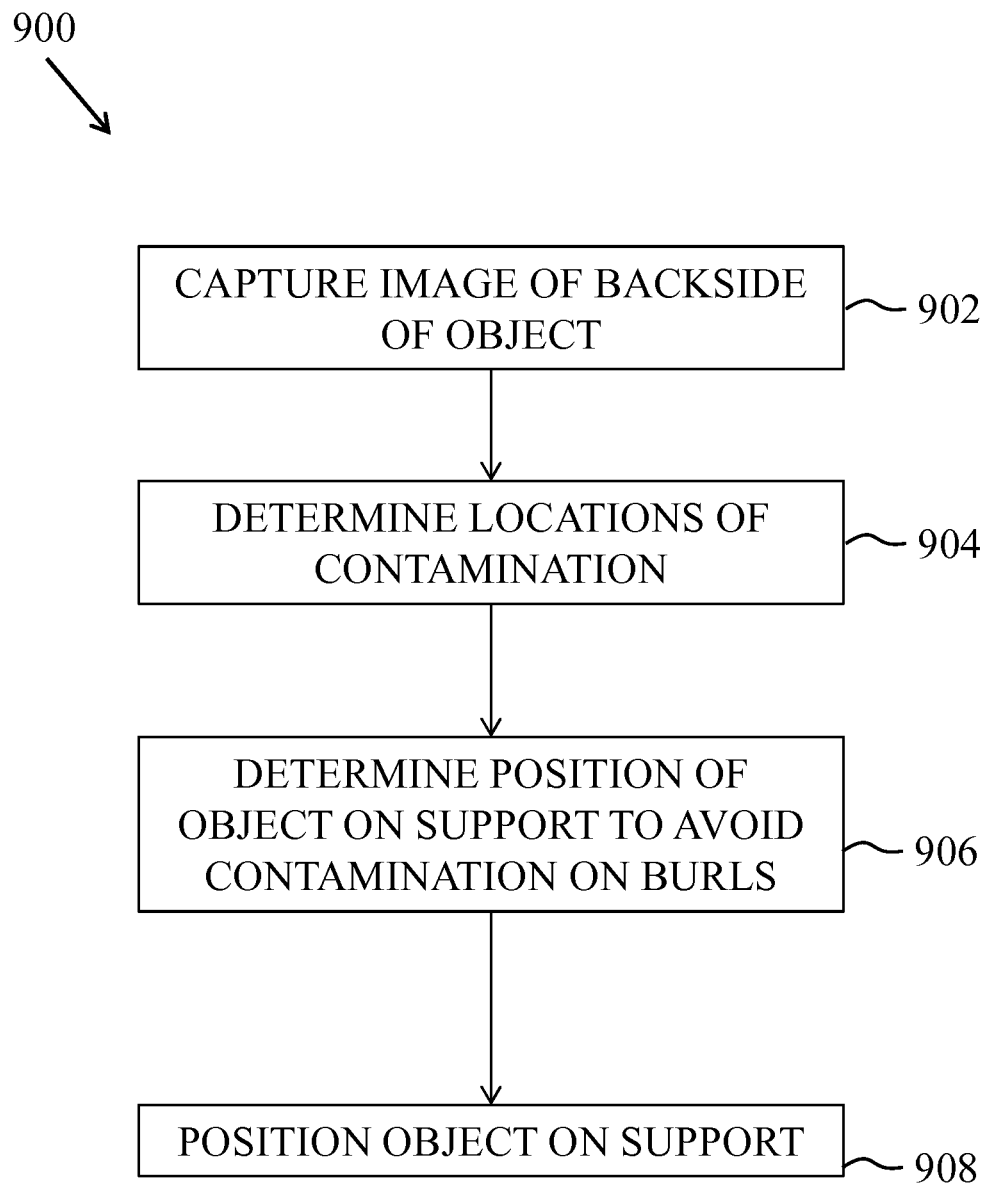
FIG. 9 is a flowchart for a process of coupling an object to a support structure, according to an embodiment of the invention.

FIG. 9 illustrates a method 900 for coupling a patterning device to a support structure, according to an embodiment. Steps of method 900 can be performed in a different order or not performed depending on specific applications. Various steps of method 900 may be performed by different components of system 800, such as by controller 806 in concert with camera 808 and robot arm 810.

In step 902, an image is captured from the backside of an object, according to an embodiment. The object may be a patterning device, such as an EUV reticle. The image may be captured using a CCD camera or from a device having a plurality of MOSFET image sensors.

In step 904, one or more locations of contamination are determined from the captured image, according to an embodiment. The one or more contamination locations may be identified through a variety of techniques. In one example, the one or more contamination locations are provided as brighter spots in the captured image due to light scattering off of the particles present on the backside of the object being imaged. In another example, image recognition algorithms may be used to determine any abnormal regions caused by the presence of contamination.

In step 906, a position of the object related to a support structure is determined such that the one or more locations of contamination do not contact any of the burls on the support structure, according to an embodiment. The determined position may involve shifting the object in an X-Y plane parallel to a largest surface of the support structure. The shifting between the object and the support structure may only be on the order of micrometers, or on the order of nanometers. In some embodiments, the determined position may involve rotating the object about an axis normal to the X-Y plane (Z-direction) in order to avoid or minimize the alignment of each of the one or more locations of contamination over any of the burls of the support structure.

In step 908 the object is positioned on the support where it may be clamped by the support, according to an embodiment. The object is positioned in accordance with the determined position from step 906. The object may be positioned using a robot arm that is designed to move the object in at least three degrees of freedom, or in at least six degrees of freedom.

Figure 10:
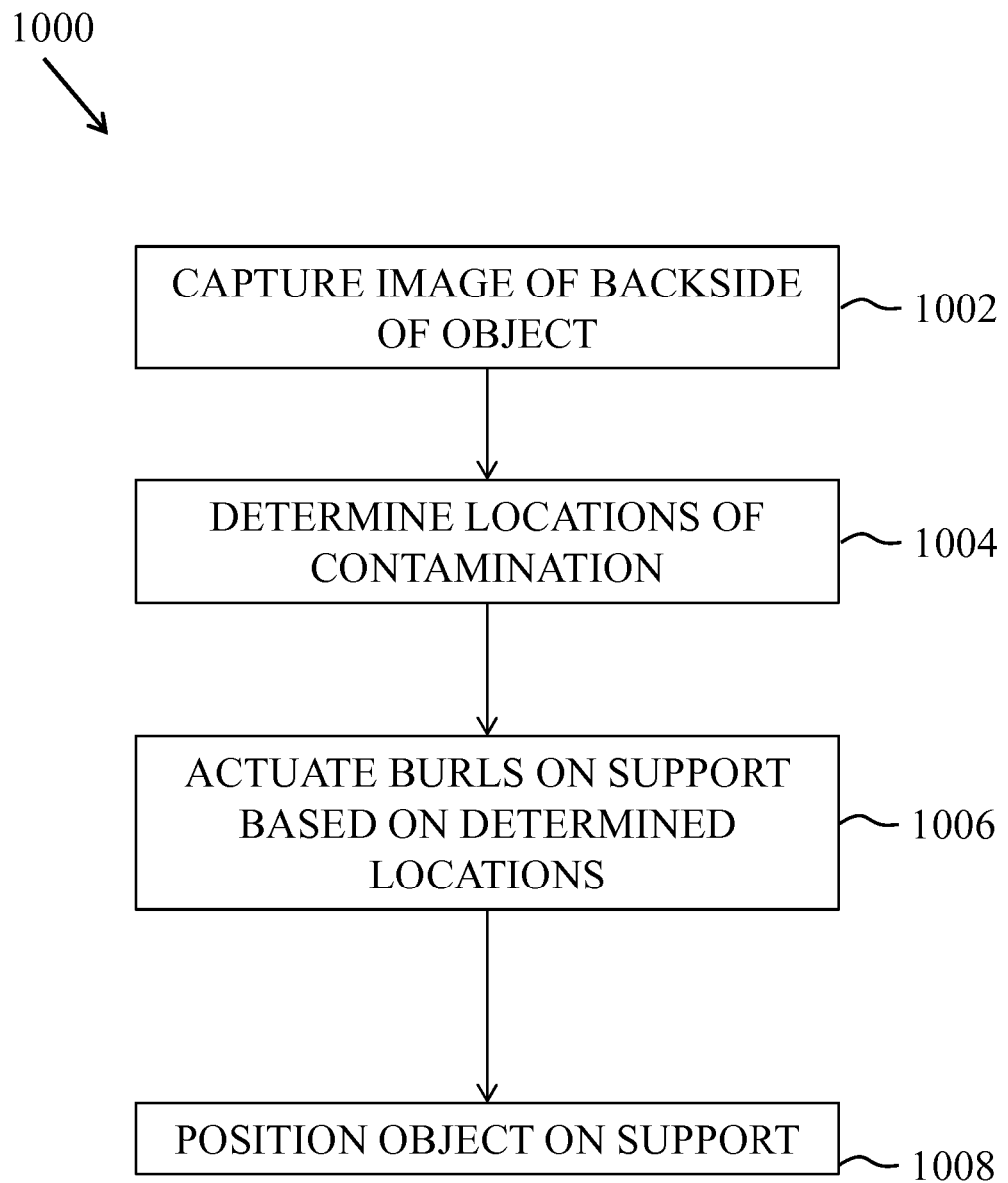
FIG. 10 is a flowchart for a process of coupling an object to a support structure, according to an embodiment of the invention.

FIG. 10 illustrates another method 1000 for coupling a patterning device to a support structure, according to an embodiment. Steps of method 1000 can be performed in a different order or not performed depending on specific applications. Various steps of method 1000 may be performed by different components of system 800, such as by controller 806 in concert with camera 808, robot arm 810, and actuators on support structure 804.

In step 1002, an image is captured from the backside of an object, according to an embodiment. The object may be a patterning device, such as an EUV reticle. The image may be captured using a CCD camera or from a device having a plurality of MOSFET image sensors.

In step 1004, one or more locations of contamination are determined from the captured image, according to an embodiment. The one or more contamination locations may be identified through a variety of techniques. In one example, the one or more contamination locations are provided as brighter spots in the captured image due to light scattering off of the particles present on the backside of the object being imaged. In another example, image recognition algorithms may be used to determine any abnormal regions caused by the presence of contamination.

In step 1006, one or more burls on the support structure are actuated based on the determined one or more locations of contamination, according to an embodiment. The burls may be individually actuated, or entire groups of burls may be actuated together via a single actuator. The actuation moves the burls in a direction normal to a largest surface of the support structure, such that burls are retracted towards the surface of the support structure. The burls may be actuated using a piezoelectric actuator, a thermoelectric actuator, or a magnetostrictive actuator. Burls may be actuated (e.g., retracted) such that they do not contact any of the one or more locations of contamination on the backside of the object when the object is clamped to the support structure.

In step 1008, the object is positioned on the support where it may be clamped by the support, according to an embodiment. The object may be positioned using a robot arm that is designed to move the object in at least three degrees of freedom, or in at least six degrees of freedom. According to an embodiment, burls on the support structure that would have contacted contamination on the backside of the object are retracted such that they do not contact the contamination when the object is positioned and clamped to the support structure.

In some situations, it may be advantageous to employ more than one technique for avoiding contact between contamination on the backside of the object and the burls on the support structure. For example, it may be challenging to find a position of the object that substantially minimizes or eliminates the contact between the contamination and the burls. If a position of the object that substantially minimizes or eliminates the contact between the contamination and the burls cannot be determined, then select burls or groups of burls may be retracted to avoid the contamination. In another embodiment, a best position of the object is determined that minimizes the contact between the contamination and the burls, and any burls that would still contact the contamination are then retracted, such that both techniques are used together to avoid contacting any contamination locations with the burls.

Figure 11:
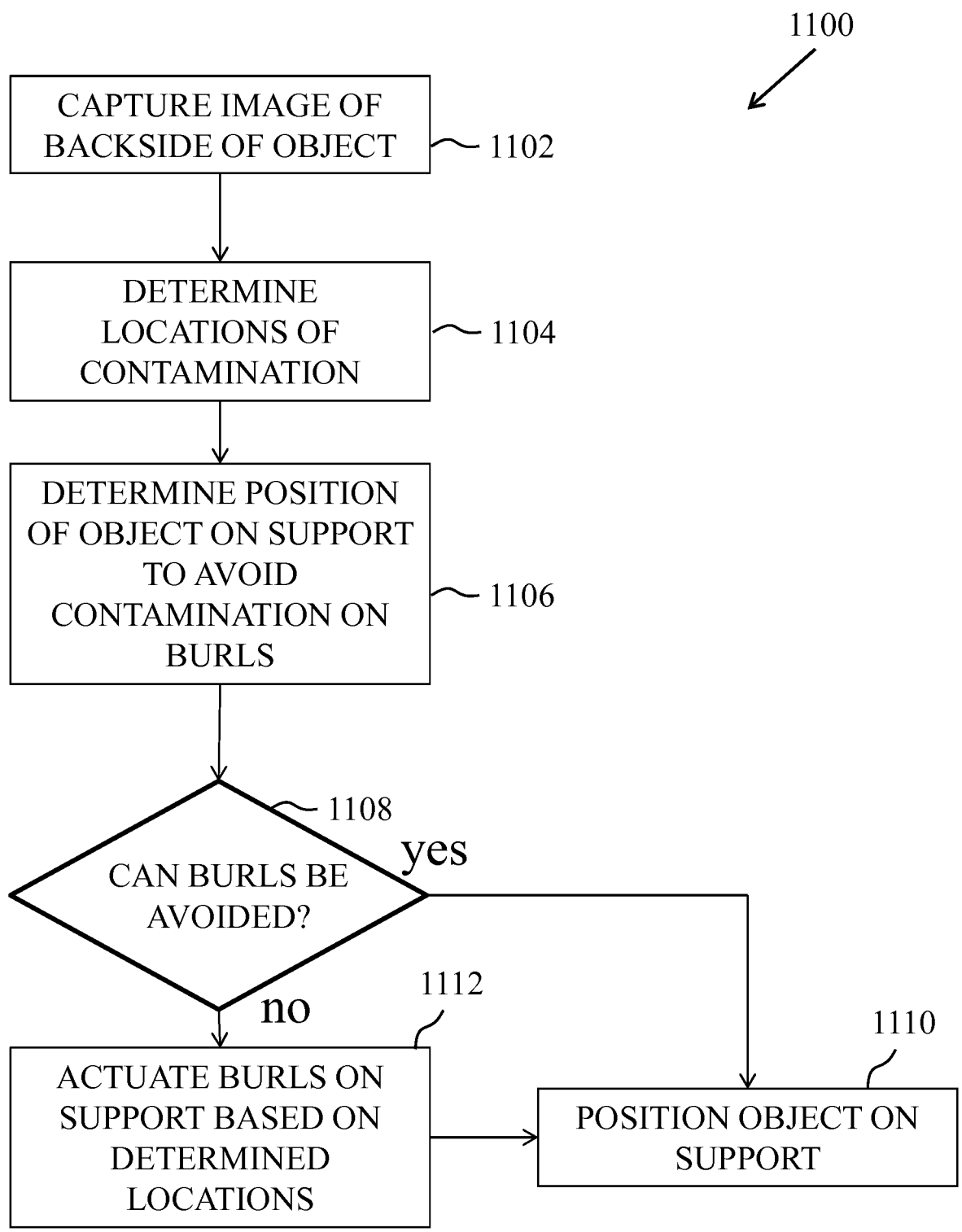
FIG. 11 is a flowchart for a process of coupling an object to a support structure, according to an embodiment of the invention.

FIG. 11 illustrates another method 1100 for coupling a patterning device to a support structure that leverages both techniques discussed herein, according to an embodiment. Steps of method 1100 can be performed in a different order or not performed depending on specific applications. Various steps of method 1100 may be performed by different components of system 800, such as by controller 806 in concert with camera 808, robot arm 810, and actuators on support structure 804.

In step 1102, an image is captured from the backside of an object, according to an embodiment. The object may be a patterning device, such as an EUV reticle. The image may be captured using a CCD camera or from a device having a plurality of MOSFET image sensors.

In step 1104, one or more locations of contamination are determined from the captured image, according to an embodiment. The one or more contamination locations may be identified through a variety of techniques. In one example, the one or more contamination locations are provided as brighter spots in the captured image due to light scattering off of the particles present on the backside of the object being imaged. In another example, image recognition algorithms may be used to determine any abnormal regions caused by the presence of contamination.

In step 1106, a position of the object related to a support structure is determined such that the one or more locations of contamination do not contact any of the burls on the support structure, according to an embodiment. The determined position may involve shifting the object in an X-Y plane parallel to a largest surface of the support structure. The shifting between the object and the support structure may only be on the order of micrometers, or on the order of nanometers. In some embodiments, the determined position may involve rotating the object about an axis normal to the X-Y plane (Z-direction) in order to avoid or minimize the alignment of each of the one or more locations of contamination over any of the burls of the support structure.

In step 1108, a determination is made regarding whether enough burls can be avoided using the determined position of the object from step 1106, according to an embodiment. This determination may depend on any given application. For example, a threshold may be set for a maximum number of burls that can come into contact with contamination. The threshold may be 0, such that no burls are allowed to contact contamination, or the requirements may be less strict such that the threshold may be 3 burls or 5 burls that can acceptably contact contamination.

If the determined position of the object results in no burls contacting contamination (or less than a threshold amount), then method 1100 continues on to step 1110 where the object is positioned on the support based on the determined position in step 1106, according to an embodiment. The object may be positioned using a robot arm that is designed to move the object in at least three degrees of freedom, or in at least six degrees of freedom.

If the determined position of the object results in too many burls contacting contamination (i.e., greater than a set threshold), the method 1100 continues on to step 1112 where burls that would contact the contamination are actuated, according to an embodiment. The burls may be individually actuated, or entire groups of burls may be actuated together via a single actuator. The actuation moves the burls in a direction normal to a largest surface of the support structure, such that burls are retracted towards the surface of the support structure. The burls may be actuated using a piezoelectric actuator, a thermoelectric actuator, or a magnetostrictive actuator. Burls may be actuated (e.g., retracted) such that they do not contact any of the one or more locations of contamination on the backside of the object when the object is clamped to the support structure.

The embodiments may further be described using the following clauses:

1. A lithographic apparatus configured to image a pattern onto a substrate using extreme ultraviolet (EUV) radiation, comprising:
   an illumination system configured to receive EUV radiation and to direct the EUV radiation towards a patterning device, such that patterned EUV radiation is reflected from the patterning device;
   a support structure comprising a plurality of burls and configured to support the patterning device on the plurality of burls;
   a projection system configured to receive the patterned EUV radiation and to direct the patterned EUV radiation towards the substrate; and
   a controller configured to:
   receive image data corresponding to a backside of the patterning device, determine one or more locations of contamination on the backside of the patterning device from the image data, and determine a position of the pattering device in an X-Y plane such that the one or more locations of contamination on the backside of the patterning device does not align with any of the plurality of burls on the support structure.

2. The lithographic apparatus of clause 1, further comprising a camera module configured to capture an image of the backside of the patterning device and to provide the image data to the controller.

3. The lithographic apparatus of clause 1, further comprising a mechanical arm configured to bring the patterning device into contact with the support structure.

4. The lithographic apparatus of clause 3, wherein the controller is further configured to actuate the mechanical arm to couple the patterning device with the support structure based on the determined position.

5. The lithographic apparatus of clause 1, wherein the plurality of burls are between 1 micrometer and 20 micrometers in height.

6. A lithographic apparatus configured to image a pattern onto a substrate using extreme ultraviolet (EUV) radiation, comprising:

an illumination system configured to receive EUV radiation and to direct the EUV radiation towards a patterning device, such that patterned EUV radiation is reflected from the patterning device;

a support structure comprising a plurality of burls and configured to support the patterning device on the plurality of burls;

an actuator coupled to at least one burl of the plurality of burls and configured to move the at least one burl in a direction normal to a largest surface of the support structure;

a projection system configured to receive the patterned EUV radiation and to direct the patterned EUV radiation towards the substrate; and a controller configured to:
receive image data corresponding to a backside of the patterning device,
determine one or more locations of contamination on the backside of the patterning device, and
activate the actuator to move the at least one burl away from the one or more locations of contamination on the backside of the patterning device.

7. The lithographic apparatus of clause 6, further comprising a camera module configured to capture an image of the backside of the patterning device and to provide the image data to the controller.

8. The lithographic apparatus of clause 6, further comprising a mechanical arm configured to bring the patterning device into contact with the support structure.

9. The lithographic apparatus of clause 6, wherein the plurality of burls are between 5 micrometers and 15 micrometers in height.

10. The lithographic apparatus of clause 6, wherein the actuator comprises a piezoelectric element, a thermoelectric element, or a magnetostrictive element.

11. A system configured to couple a patterning device to a support structure having a plurality of burls, comprising:
a camera module configured to capture image data of a backside of the patterning device;
a mechanical arm configured to support the patterning device and bring the patterning device into contact with the plurality of burls on the support structure; and a controller configured to:
receive the image data captured from the camera module,
determine one or more locations of contamination on the backside of the patterning device from the image data,
determine a position of the pattering device in an X-Y plane such that the one or more locations of contamination on the backside of the patterning device does not align with any of the plurality of burls on the support structure, and
based on the determined position, control the mechanical arm to couple the patterning device with the support structure.

12. The system of clause 11, wherein the camera module comprises a charge-coupled device (CCD) camera.

13. The system of clause 11, wherein the patterning device is electrostatically clamped to the support structure via the plurality of burls on the support structure.

14. The system of clause 11, wherein the plurality of burls are between 5 micrometers and 15 micrometers in height.

15. The system of clause 11, wherein the patterning device comprises a reflective surface configured to reflect EUV radiation.

16. A system configured to couple a patterning device to a support structure having a plurality of burls, comprising:
a camera module configured to capture image data of a backside of the patterning device;
an actuator coupled to at least one burl of the plurality of burls and configured to move the at least one burl in a direction normal to a largest surface of the support structure; and a controller configured to:
receive the image data captured from the camera module,
determine one or more locations of contamination on the backside of the patterning device from the image data, and
based on the determined one or more locations of contamination, control the actuator to move the at least one burl of the plurality of burls away from the one or more locations of contamination on the backside of the patterning device.

17. The system of clause 16, wherein the camera module comprises a charge-coupled device (CCD) camera.

18. The system of clause 16, wherein the patterning device is electrostatically clamped to the support structure via the plurality of burls on the support structure.

19. The system of clause 16, wherein the actuator comprises a piezoelectric element, a thermoelectric element, or a magnetostrictive element.

20. The system of clause 16, wherein the patterning device comprises a reflective surface configured to reflect EUV radiation.

21. A method of coupling a patterning device to a support structure having a plurality of burls, comprising:
capturing an image of a backside of the patterning device;
determining, from the captured image, one or more locations of contamination on the backside of the patterning device;
determining a position of the pattering device in an X-Y plane such that the one or more locations of contamination on the backside of the patterning device does not align with any of the plurality of burls on the support structure; and
positioning the patterning device over the plurality of burls, based on the determined position.

22. The method of clause 21, wherein capturing the image comprises capturing the image using a CCD camera.

23. The method of clause 21, further comprising: actuating one or more burls of the plurality of burls, such that the one or more burls are moved away from the one or more locations of contamination on the backside of the patterning device.

24. The method of clause 21, further comprising: electrostatically clamping the patterning device to the support structure via the plurality of burls.

25. The method of clause 21, further comprising: receiving EUV radiation at the patterning device.

26. The method of clause 21, further comprising: cleaning the backside of the patterning device based on the determined one or more locations of contamination.

27. A method of coupling a patterning device to a support structure having a plurality of burls, comprising:
capturing an image of a backside of the patterning device;
determining, from the captured image, one or more locations of contamination on the backside of the patterning device;
actuating one or more burls of the plurality of burls, such that the one or more burls are moved away from the one or more locations of contamination on the backside of the patterning device; and positioning the patterning device over the plurality of burls.

28. The method of clause 26, wherein capturing the image comprises capturing the image using a CCD camera.

29. The method of clause 26, further comprising: determining a position of the patterning device in an X-Y plane such that the one or more locations of contamination on the backside of the patterning device does not align with any of the plurality of burls on the support structure.

30. The method of clause 26, further comprising: electrostatically clamping the patterning device to the support structure via the plurality of burls.

31. The method of clause 26, further comprising: receiving EUV radiation at the patterning device.

32. The method of clause 26, further comprising: cleaning the backside of the patterning device based on the determined one or more locations of contamination.

Although specific reference may be made in this text to the use an electrostatic clamp in lithographic apparatus, it should be understood that the electrostatic clamp described herein may have other applications, such as for use in mask inspection apparatus, wafer inspection apparatus, aerial image metrology apparatus and more generally in any apparatus that measures or processes an object such as a wafer (or other substrate) or mask (or other patterning device) either in vacuum or in ambient (non-vacuum) conditions, such as, for example in plasma etching apparatus or deposition apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present specification is to be interpreted by those skilled in relevant art(s) in light of the teachings herein.

The terms "radiation" and "beam" as used herein encompass all types of electromagnetic radiation, including ultraviolet (UV) radiation (e.g., having a wavelength of or about 365, 355, 248, 193, 157 or 126 nm) and extreme ultraviolet (EUV) radiation (e.g., having a wavelength in the range of 5-20 nm), as well as beams of charged particles, such as ion beams or electron beams.

The term "lens", where the context allows, may refer to any one or combination of various types of optical components, including refractive, reflective, magnetic, electromagnetic and electrostatic optical components.

The term "etch" or "etching" or "etch-back" as used herein generally describes a fabrication process of patterning a material, such that at least a portion of the material remains after the etch is completed. For example, generally the process of etching a material involves the steps of patterning a masking layer (e.g., photoresist or a hard mask) over the material, subsequently removing areas of the material that are no longer protected by the mask layer, and optionally removing remaining portions of the mask layer. Generally, the removing step is conducted using an "etchant" that has a "selectivity" that is higher to the material than to the mask layer. As such, the areas of material protected by the mask would remain after the etch process is complete. However, the above is provided for purposes of illustration, and is not limiting. In another example, etching may also refer to a process that does not use a mask, but still leaves behind at least a portion of the material after the etch process is complete.

The above description serves to distinguish the term "etching" from "removing." In an embodiment, when etching a material, at least a portion of the material remains behind after the process is completed. In contrast, when removing a material, substantially all of the material is removed in the process. However, in other embodiments, 'removing' may incorporate etching.

The terms "deposit" or "dispose" as used herein describe the act of applying a layer of material to a substrate. Such terms are meant to describe any possible layer-forming technique including, but not limited to, thermal growth, sputtering, evaporation, chemical vapor deposition, epitaxial growth, atomic layer deposition, electroplating, etc.

The term "substrate" as used herein describes a material onto which subsequent material layers are added. In embodiments, the substrate itself may be patterned and materials added on top of it may also be patterned, or may remain without patterning.

The term "substantially" or "in substantial contact" as used herein generally describes elements or structures in physical substantial contact with each other with only a slight separation from each other which typically results from fabrication and/or misalignment tolerances. It should be understood that relative spatial descriptions between one or more particular features, structures, or characteristics (e.g., "vertically aligned," "substantial contact," etc.) used herein are for purposes of illustration only, and that practical implementations of the structures described herein may include fabrication and/or misalignment tolerances without departing from the spirit and scope of the present disclosure.

While specific embodiments of the invention have been described above, it will be appreciated that the invention may be practiced otherwise than as described. The description is not intended to limit the invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

The breadth and scope of the present invention should not be limited by any of the above-described exemplary embodiments, but should be defined only in accordance with the following claims and their equivalents.

What is claimed is:

1. A patterning device support system for a lithographic apparatus having a projection system configured to image a pattern onto a substrate using extreme ultraviolet (EUV) radiation, the patterning device support system comprising:
    a support structure comprising a plurality of burls and configured to support a patterning device on the plurality of burls, the patterning device configured to receive EUV radiation and to reflect patterned EUV radiation toward the projection system;
    an actuator coupled to at least one burl of the plurality of burls and configured to move the at least one burl in a direction normal to a largest surface of the support structure; and
    a controller configured to:
        receive image data corresponding to a backside of the patterning device,
        determine a plurality of locations of contamination on the backside of the patterning device from the image data,
        determine a position of the patterning device in an X-Y plane such that one or more of the locations of contamination on the backside of the patterning device does not align with any of the plurality of burls on the support structure; and
        activate the actuator to move the at least one burl away from one or more other of the locations of contamination on the backside of the patterning device.

2. The patterning device support system of claim 1, further comprising a camera module configured to capture an image of the backside of the patterning device and to provide the image data to the controller.

3. The patterning device support system of claim 1, further comprising a mechanical arm configured to bring the patterning device into contact with the support structure.

4. The patterning device support system of claim 3, wherein the controller is further configured to actuate the mechanical arm to couple the patterning device with the support structure based on the determined position.

5. A lithographic apparatus comprising:
    the patterning device support system of claim 1;
    an illumination system configured to receive EUV radiation and to direct the EUV radiation towards a patterning device supported by the support structure of the patterning device support system, such that patterned EUV radiation is reflected from the patterning device; and
    a projection system configured to receive the patterned EUV radiation and to direct the patterned EUV radiation towards a substrate.

6. A patterning device support system for a lithographic apparatus having a projection system configured to image a pattern onto a substrate using extreme ultraviolet (EUV) radiation, the patterning device support system comprising:
    a support structure comprising a plurality of burls and configured to support a patterning device on the plurality of burls, the patterning device configured to receive EUV radiation and to reflect patterned EUV radiation toward the projection system;
    an actuator coupled to at least one burl of the plurality of burls and configured to move the at least one burl in a direction normal to a largest surface of the support structure; and
    a controller configured to:
        receive image data corresponding to a backside of the patterning device,
        determine one or more locations of contamination on the backside of the patterning device, and
        activate the actuator to move the at least one burl away from the one or more locations of contamination on the backside of the patterning device to a position that would be out of contact with the contamination.

7. The patterning device support system of claim 6, further comprising a camera module configured to capture an image of the backside of the patterning device and to provide the image data to the controller.

8. The patterning device support system of claim 6, further comprising a mechanical arm configured to bring the patterning device into contact with the support structure.

9. The patterning device support system of claim 6, wherein the actuator comprises a piezoelectric element, a thermoelectric element, or a magnetostrictive element.

10. A lithographic apparatus comprising:
    the patterning device support system of claim 6;
    an illumination system configured to receive EUV radiation and to direct the EUV radiation towards a patterning device supported by the support structure of the patterning device support system, such that patterned EUV radiation is reflected from the patterning device; and a projection system configured to receive the patterned EUV radiation and to direct the patterned EUV radiation towards a substrate.

11. A system configured to couple a patterning device to a support structure having a plurality of burls, the system comprising:
- a camera module configured to capture image data of a backside of the patterning device;
- a mechanical arm configured to support the patterning device and bring the patterning device into contact with the plurality of burls on the support structure;
- an actuator coupled to at least one burl of the plurality of burls and configured to move the at least one burl in a direction normal to a largest surface of the support structure; and
- a controller configured to:
  - receive the image data captured from the camera module,
  - determine a plurality of locations of contamination on the backside of the patterning device from the image data,
  - determine a position of the patterning device in an X-Y plane such that one or more of the locations of contamination on the backside of the patterning device does not align with any of the plurality of burls on the support structure,
  - based on the determined position, control the mechanical arm to couple the patterning device with the support structure, and
  - activate the actuator to move the at least one burl away from one or more other of the locations of contamination on the backside of the patterning device.

12. The system of claim 11, wherein the camera module comprises a charge-coupled device (CCD) camera.

13. The system of claim 11, wherein the plurality of burls are between 5 micrometers and 15 micrometers in height.

14. The system of claim 11, wherein the patterning device comprises a reflective surface configured to reflect EUV radiation.

15. A lithographic apparatus comprising:
the system of claim 11;
an illumination system configured to receive EUV radiation and to direct the EUV radiation towards a patterning device supported by a support structure, such that patterned EUV radiation is reflected from the patterning device; and
a projection system configured to receive the patterned EUV radiation and to direct the patterned EUV radiation towards a substrate.

16. A method of coupling a patterning device to a support structure having a plurality of burls, the method comprising:
capturing an image of a backside of the patterning device;
determining, from the captured image, a plurality of locations of contamination on the backside of the patterning device;
determining a position of the patterning device in an X-Y plane such that one or more of the locations of contamination on the backside of the patterning device does not align with any of the plurality of burls on the support structure;
positioning the patterning device over the plurality of burls, based on the determined position; and
moving, in a direction normal to, and with respect to, a largest surface of the support structure, at least one of the burls away from one or more other of the locations of contamination on the backside of the patterning device.

17. The method of claim 16, wherein capturing the image comprises capturing the image using a charge-coupled device (CCD) camera.

18. The method of claim 16, further comprising actuating one or more burls of the plurality of burls, such that the one or more burls are moved away from the one or more locations of contamination on the backside of the patterning device.

19. The method of claim 16, further comprising receiving EUV radiation at the patterning device.

20. The method of claim 16, further comprising cleaning the backside of the patterning device based on the determined one or more locations of contamination.

21. A method of coupling a patterning device to a support structure having a plurality of burls, the method comprising:
capturing an image of a backside of the patterning device;
determining, from the captured image, one or more locations of contamination on the backside of the patterning device;
actuating one or more burls of the plurality of burls, such that the one or more burls are moved away from the one or more locations of contamination on the backside of the patterning device to a position that would be out of contact with the contamination; and
positioning the patterning device over the plurality of burls.

22. The method of claim 21, wherein capturing the image comprises capturing the image using a charge-coupled device (CCD) camera.

23. The method of claim 21, further comprising determining a position of the patterning device in an X-Y plane such that the one or more locations of contamination on the backside of the patterning device does not align with any of the plurality of burls on the support structure.

24. The method of claim 21, further comprising receiving EUV radiation at the patterning device.

25. The method of claim 21, further comprising cleaning the backside of the patterning device based on the determined one or more locations of contamination.

* * * * *